United States Patent
Yoshikawa et al.

(10) Patent No.: US 9,570,671 B2
(45) Date of Patent: Feb. 14, 2017

(54) MAGNETIC MEMORY DEVICE

(71) Applicants: Masatoshi Yoshikawa, Seoul (KR); Hiroaki Yoda, Kanagawa (JP); Shuichi Tsubata, Seoul (KR); Kenji Noma, Kanagawa (JP); Tatsuya Kishi, Seongnam-si (KR); Satoshi Seto, Seoul (KR); Kazuhiro Tomioka, Seoul (KR)

(72) Inventors: Masatoshi Yoshikawa, Seoul (KR); Hiroaki Yoda, Kanagawa (JP); Shuichi Tsubata, Seoul (KR); Kenji Noma, Kanagawa (JP); Tatsuya Kishi, Seongnam-si (KR); Satoshi Seto, Seoul (KR); Kazuhiro Tomioka, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 46 days.

(21) Appl. No.: 14/479,192

(22) Filed: Sep. 5, 2014

(65) Prior Publication Data
US 2015/0263265 A1  Sep. 17, 2015

Related U.S. Application Data

(60) Provisional application No. 61/952,047, filed on Mar. 12, 2014.

(51) Int. Cl.
*H01L 43/02* (2006.01)
*H01L 43/08* (2006.01)
*H01L 43/12* (2006.01)

(52) U.S. Cl.
CPC ............... *H01L 43/02* (2013.01); *H01L 43/08* (2013.01); *H01L 43/12* (2013.01)

(58) Field of Classification Search
USPC ........................................................ 257/421
IPC .................................. H01L 43/02,43/08, 43/12
See application file for complete search history.

(56) References Cited

U.S. PATENT DOCUMENTS

| | | |
|---|---|---|
| 6,256,223 B1 | 7/2001 | Sun |
| 6,842,317 B2 | 1/2005 | Sugita et al. |
| 8,514,617 B2 | 8/2013 | Yamada et al. |
| 8,604,573 B2 | 12/2013 | Yamakawa et al. |
| 2012/0286339 A1 | 11/2012 | Asao |
| 2012/0326252 A1* | 12/2012 | Yamakawa ............ H01L 27/222 257/421 |

FOREIGN PATENT DOCUMENTS

| | | |
|---|---|---|
| JP | 2005327859 A | 11/2005 |
| JP | 2008283202 A | 11/2008 |

OTHER PUBLICATIONS

U.S. Appl. No. 14/202,622; First Named Inventor: Koji Yamakawa; Title: "Magnetic Memory and Method for Manufacturing the Same"; filed Mar. 10, 2014.

(Continued)

*Primary Examiner* — Hrayr A Sayadian
(74) *Attorney, Agent, or Firm* — Holtz, Holtz & Volek PC

(57) ABSTRACT

According to one embodiment, a magnetic memory device includes a stacked structure including a magnetic element, a protective insulating film covering the stacked structure, and an interface layer provided at an interface between the stacked structure and the protective insulating film. The interface layer contains a predetermined element which is not contained in the magnetic element or the protective insulating film.

10 Claims, 3 Drawing Sheets

(56) References Cited

OTHER PUBLICATIONS

U.S. Appl. No. 14/456,883, filed Aug. 11, 2014, First Named Inventor: Kazuhiro Tomioka, Title: "Manufacturing Method of Magnetic Memory Device and Manufacturing Apparatus of Magnetic Memory Device".

U.S. Appl. No. 14/479,180, filed Sep. 5, 2014, First Named Inventor: Masatoshi Yoshikawa, Title: "Magnetic Memory Having Magnetoresistive Element and Method of Manufacturing Magnetoresistive Element".

U.S. Appl. No. 14/481,817, filed Sep. 9, 2014, First Named Inventor: Kazuhiro Tomioka, Title: "Manufacturing Method of Magnetic Memory Device and Manufacturing Apparatus of Magnetic Memory Device".

* cited by examiner

US 9,570,671 B2

MAGNETIC MEMORY DEVICE

CROSS-REFERENCE TO RELATED APPLICATIONS

This application claims the benefit of U.S. Provisional Application No. 61/952,047, filed Mar. 12, 2014, the entire contents of which are incorporated herein by reference.

FIELD

Embodiments described herein relate generally to a magnetic memory device.

BACKGROUND

Recently, many kinds of solid-state memories which record data based on new principles have been suggested. In particular, as a solid-state magnetic memory, a magnetoresistive random access memory (MRAM) comprising a magnetoresistive tunneling junction (MTJ) element using the magneto resistance (MR) effect is known. Currently, the MRAM stores the information of 0 or 1 depending on the state of magnetization of the storage layer of an MTJ element.

The MTJ element includes a magnetic storage layer (hereinafter, storage layer) and a magnetic reference layer (hereinafter, reference layer). In the storage layer, data is stored and the magnetization is variable. In the reference layer, the magnetization is fixed and does not move. When the direction of magnetization of the storage layer is parallel to the direction of magnetization of the reference layer, the resistance is low (0 state); when anti-parallel, the resistance is high (1 state). This difference in resistance is used to determine the information.

As a method for writing data to the MTJ element, a current magnetic-field-writing system (hereinafter, magnetic-field writing) by the current magnetic field from a bit line is known. In this system, lines are provided near the MTJ element. By the magnetic field produced by the current flowing through the lines, the magnetization of the storage layer of the MTJ element is inverted. When the MTJ element is made small to miniaturize the MRAM, the magnetic field necessary to invert the storage layer of the MTJ element increases. In sum, the magnetic coercive force Hc is increased. Thus, in the magnetic-field-writing MRAM, a large current magnetic field is required in association with the development of the miniaturization, and the write current is large. As a result, it is difficult to realize both the miniaturization and the low current of the memory cell for the purpose of increasing the capacity.

To solve this problem, a writing system (hereinafter, spin transfer torque writing) using spin-momentum transfer (SMT) is suggested.

In a spin transfer torque writing MRAM, the state of magnetization of the storage layer of the MTJ element is changed (inverted) by vertically passing current into the film surface of each film constituting the MTJ element.

In the magnetization inversion by spin transfer torque, the current Ic necessary for magnetization inversion is defined by the current density Jc. Therefore, if the area of the surface of the MTJ element in which current passes is reduced, the injection current Ic for inverting the magnetization is also decreased. In a case where writing is performed with a constant current density, when the MTJ element is small, the current Ic is also small. Thus, the spin transfer torque writing system is, in principle, scalable. With the spin transfer torque writing system, an MRAM with a large capacity has become possible.

The above-described MTJ element (magnetic element) is covered by a protective insulating film. However, generally, the coefficient of thermal expansion of the material contained in the MTJ element (magnetic element) is greater than the coefficient of thermal expansion of the material contained in the protective insulating film. Therefore, a thermal stress may be applied between the magnetic element and the protective insulating film, and have a negative influence on the characteristic and reliability of the magnetic memory device.

In view of the above factors, an MRAM comprising an MTJ element in which the stress between an MTJ element (magnetic element) and a protective insulating film is reduced is desired.

DETAILED DESCRIPTION

In general, according to one embodiment, a magnetic memory device includes a stacked structure including a magnetic element; a protective insulating film covering the stacked structure; and an interface layer provided at an interface between the stacked structure and the protective insulating film. The interface layer contains a predetermined element which is not contained in the magnetic element or the protective insulating film.

Embodiments will be described hereinafter with reference to the accompanying drawings.

Embodiment 1

Figure 3:
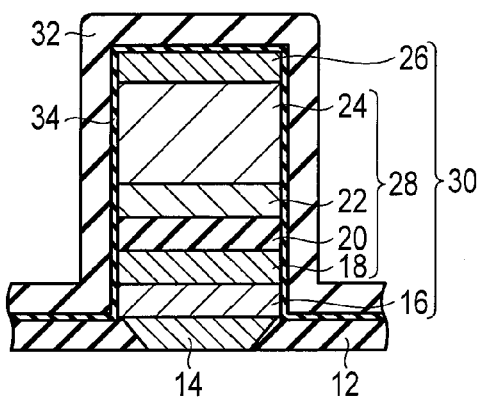
FIG. 3 is a cross-sectional view schematically showing a part of the method for manufacturing the magnetic memory device according to the first embodiment.

FIG. 3 is a cross-sectional view schematically showing a structure of a magnetic memory device according to a first embodiment.

As shown in FIG. 3, an insulating film 12 is provided in a bottom part region which is not shown in the figure, and a bottom electrode 14 is formed within the insulating film 12. The bottom part region includes a semiconductor substrate, a transistor and an interconnection, etc.

An MTJ element based on the stack of a magnetic layer/a tunnel barrier layer/a magnetic layer is formed on the bottom electrode 14. The MTJ element is included in a stacked structure 30 basically including an underlayer 16, a storage layer 18, a tunnel barrier layer 20, a reference layer 22, a shift cancelling layer 24 and a cap layer 26. A spacer layer may be formed between the reference layer 22 and the shift cancelling layer 24.

The basic unit of a magnetoresistive effect element (magnetic element) 28 is formed by the storage layer (first magnetic layer) 18, the tunnel barrier layer (nonmagnetic layer) 20 and the reference layer (second magnetic layer) 22 described above. In other words, the magnetic tunneling junction (MTJ) element 28 having the tunnel barrier layer (nonmagnetic layer) 20 between the storage layer (first magnetic layer) 18 and the reference layer (second magnetic layer) 22 is formed.

The MTJ element is not limited to the bottom-SL structure of FIG. 3 in which the storage layer is provided under the tunnel barrier layer. The MTJ element includes a top-SL structure, in which the position of the storage layer and the reference layer is adverse, and an RL-SCL separation structure, in which the storage layer is provided between the reference layer and the shift canceling layer, etc.

The storage element 28 is a magnetoresistive effect element of a perpendicular magnetization type of a spin-transfer-torque (STT) system. A binary value (0 or 1) is stored depending on whether the direction of magnetization of the storage layer 18 is parallel or anti-parallel to the direction of magnetization of the reference layer 22. A binary value is set in accordance with the direction of the current flowing through the storage element 28.

The stacked structure 30 including the storage element 28, the underlayer 16 and the cap layer 26 is covered by a protective insulating film 32. The protective film has a thermal stress produced by the temperature at the time of formation and an in-film-stress (intrinsic stress) of which the protective film itself is possessed. The thermal stress is produced by the difference in coefficient of thermal expansion between the magnetic element and the protective film. The intrinsic stress is the stress which relies on the film density and the composition of the protective film, etc., and can be controlled by composition control or a film formation method. An interface layer 34 is formed at the interface between the stacked structure 30 and the protective insulating film 32.

The magnetic element 28 contains at least one of cobalt (Co), iron (Fe), boron (B), magnesium (Mg) and platinum (Pt). In this embodiment, for example, the storage layer 18 and the reference layer 22 contain CoFeB. A CoFeB layer may be included. The tunnel barrier layer 20 includes, for example, MgO. The shift cancelling layer 24 includes, for example, a CoPt film or a Co/Pt stacked film.

The protective insulating film 32 contains silicon (Si) and nitrogen (N). Specifically, the protective insulating film 32 is formed by a silicon nitride film (SiN film).

The linear coefficient of thermal expansion (linear CTE) of at least one material contained in the magnetic element 28 is greater than the linear CTE of the material contained in the protective insulating film 32. For example, the linear CTE of the above-described silicon nitride film is approximately $3.5 \times 10^{-6}$/K. The linear CTE of CoFeB is approximately $12.6 \times 10^{-6}$/K. The linear CTE of MgO is approximately $9.7 \times 10^{-6}$/K.

The interface layer 34 may contain a predetermined element which is not contained in the magnetic element 28 or the protective insulating film 32. In this case, the predetermined element is selected from argon (Ar), xenon (Xe), krypton (Kr), neon (Ne), phosphorus (P) and carbon (C).

The interface layer 34 may be structured in the following manner: the interface layer 34 contains the predetermined element, and the concentration of the predetermined element contained in the interface layer 34 is higher than the concentration of the predetermined element contained in the magnetic element 28 and the concentration of the predetermined element contained in the protective insulating film 32. In this case, the predetermined element is selected from nitrogen (N) and boron (B).

As described later, the interface layer 34 is formed by ion-implanting the predetermined element into the interface between the magnetic element 28 and the protective insulating film 32. Thus, the interface layer 34 includes a mixing layer containing the element contained in the magnetic element 28, the element contained in the protective insulating film 32 and the predetermined element which is ion-implanted.

As described above, generally, the coefficient of thermal expansion of the material contained in the magnetic element is greater than the coefficient of thermal expansion of the material contained in the protective insulating film. Therefore, in the normal magnetic memory device, a thermal stress may be applied between the magnetic element and the protective insulating film, and have a negative influence on the characteristic and reliability of the magnetic memory device.

In this embodiment, the interface layer 34 is provided at the interface between the stacked structure 30 including the magnetic element 28 and the protective insulating film 32. By the interface layer 34, the stress between the magnetic element 28 and the protective insulating film 32 can be reduced. Thus, it is possible to obtain a magnetic storage device which is excellent in the characteristic and reliability.

Figure 1:
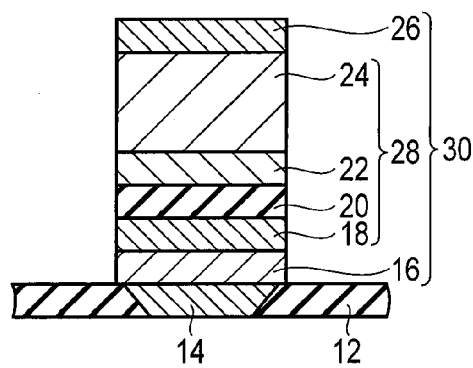
FIG. 1 is a cross-sectional view schematically showing a part of a method for manufacturing a magnetic memory device according to a first embodiment.
Figure 2:
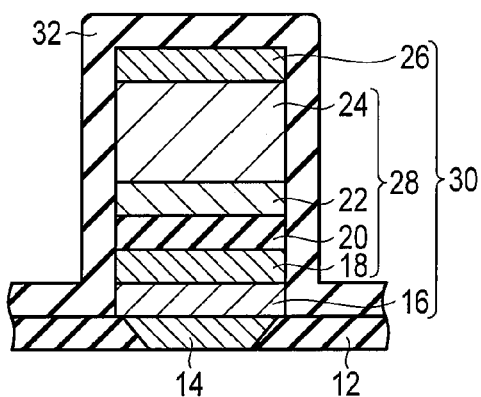
FIG. 2 is a cross-sectional view schematically showing a part of the method for manufacturing the magnetic memory device according to the first embodiment.

FIG. 1 to FIG. 3 are cross-sectional views schematically showing the method for manufacturing the magnetic memory device according to the first embodiment.

First, as shown in FIG. 1, the insulating film 12 and the bottom electrode 14 are formed. Then, the stacked structure 30 including the underlayer 16, the storage layer 18, the tunnel barrier layer 20, the reference layer 22, the shift cancelling layer 24 and the cap layer 26 is formed on the bottom electrode 14. The stacked structure 30 includes the magnetic element 28.

Next, as shown in FIG. 2, a silicon nitride film is formed as the protective insulating film 32. Specifically, the silicon nitride film is formed at the temperature of approximately 300° C. by the CVD. The stacked structure 30 is covered by the silicon nitride film 32.

Next, as shown in FIG. 3, the predetermined element is ion-implanted into the interface between the stacked structure 30 and the protective insulating film 32. The predetermined element is selected from argon (Ar), xenon (Xe), krypton (Kr), neon (Ne), phosphorus (P), carbon (C), nitrogen (N) and boron (B). Two or more than two predetermined elements may be ion-implanted. The process temperature at the time of ion-implantation is, for example, approximately a room temperature.

By ion-implanting the predetermined element, the interface layer 34 is formed at the interface between the stacked structure 30 and the protective insulating film 32. The interface layer 34 includes a mixing layer containing the element contained in the magnetic element 28, the element contained in the protective insulating film 32 and the predetermined element which is ion-implanted. As a result of the atom migration at the time of forming the mixing layer, the stress at the interface between the stacked structure 30 and the protective insulating film 32 can be reduced.

Afterward, the magnetic memory device is completed through an interconnection step, etc.

As described above, by ion-implanting the predetermined element into the interface between the stacked structure 30 and the protective insulating film 32, the interface layer 34 can be formed at the interface between the stacked structure 30 and the protective insulating film 32. Thus, the stress between the stacked structure 30 and the protective insulating film 32 can be reduced. Therefore, a magnetic memory device which is excellent in the characteristic and reliability can be obtained.

In the above-described embodiment, the protective insulating film (silicon nitride film) 32 is formed at the temperature of approximately 300° C. However, the silicon nitride film may be formed at a temperature lower than 300° C. For example, the silicon nitride film may be formed at a temperature of, or lower than 200° C. When the silicon nitride film is formed at a temperature of, or lower than 200° C., for example, trisilylamine (TSA) ($N(SiH_3)_3$) can be used as gas for the CVD. As the decomposition temperature of the TSA is low (approximately 100 to 200° C.), the silicon nitride film can be formed even at a low temperature. By forming the silicon nitride film at a low temperature, the thermal stress between the magnetic element 28 and the protective insulating film 32 can be further reduced.

When the silicon nitride film is formed at a temperature of, or lower than 200° C. as described above, the thermal stress can be reduced to some extent without ion-implanting the predetermined element.

In the above embodiment, the silicon nitride film (SiN film) is used as the protective insulating film 32. However, as the protective insulating film 32, a silicon oxide film ($SiO_2$ film) or a silicon oxynitride film (SiON film) may be used.

Embodiment 2

Figure 5:
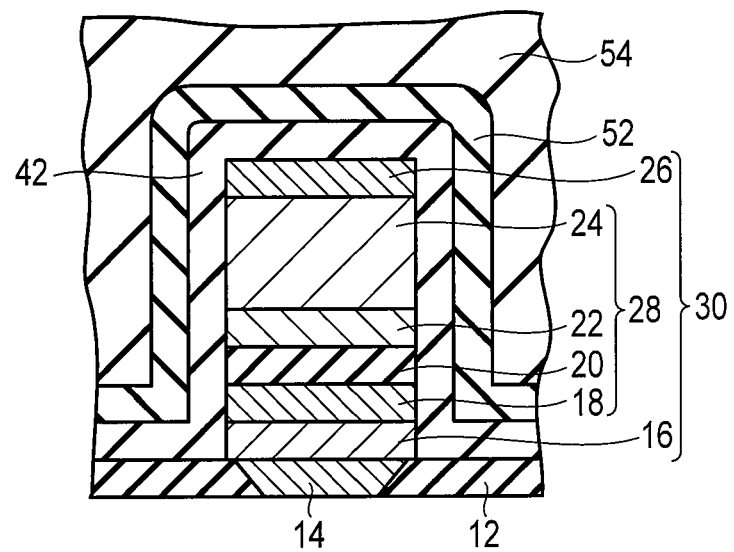
FIG. 5 is a cross-sectional view schematically showing a part of the method for manufacturing the magnetic memory device according to the second embodiment.

FIG. 5 is a cross-sectional view schematically showing a structure of a magnetic memory device according to a second embodiment. The basic structure of the second embodiment is the same as the first embodiment. Therefore, the structural components which correspond to the first embodiment are designated by the same reference numbers and symbols. Thus, the explanations of the matters written in the first embodiment are omitted.

In the magnetic memory device of this embodiment, a protective insulating film 42 covering a stacked structure 30 is formed from a metallic oxide. The metal element contained in the metallic oxide is selected from yttrium (Y), aluminum (Al), magnesium (Mg), calcium (Ca) and zirconium (Zr). Specifically, as the metallic oxide, $Y_2O_3$, $Al_2O_3$, Mgo, Cao and $ZrO_X$ can be considered.

The linear coefficients of thermal expansion of the above metallic oxides are as follows:

| | |
|---|---|
| $Y_2O_3$ | $7.3 \times 10^{-6}$/K |
| $Al_2O_3$ | $7.2 \times 10^{-6}$/K |
| MgO | $9.7 \times 10^{-6}$/K |
| CaO | $13.6 \times 10^{-6}$/K |
| $ZrO_x$ | $10.5 \times 10^{-6}$/K |

The linear coefficients of thermal expansion of MgO and CoFeB which are typical materials constituting a magnetic element 28 are as follows:

| | |
|---|---|
| MgO | $9.7 \times 10^{-6}$/K |
| CoFeB | $12.6 \times 10^{-6}$/K |

As clear from the above descriptions, the linear coefficients of thermal expansion of $Y_2O_3$, $Al_2O_3$, MgO, CaO and $ZrO_X$ are close to the linear coefficients of thermal expansion of MgO and CoFeB which are typical materials constituting the magnetic element 28. Therefore, by using these metallic oxides as the protective insulating film 42, the thermal stress can be reduced. Further, composites of $Y_2O_3$, $Al_2O_3$, MgO, CaO and $ZrO_X$ can be also used as the protective film. For example, AlMgO and AlCaO can be used. B, C, P, etc., which can be present between lattices may be contained. In this case, the metallic oxide protective film is finely micro-crystalline or amorphous. The micro-crystalline or amorphous film is preferable in terms of the reduction in stress.

By using the above metallic oxides as the protective insulating film 42, it is possible to reduce the stress between the magnetic element 28 and the protective insulating film 42. Thus, a magnetic memory device which is excellent in the characteristic and reliability can be obtained.

The linear CTE of MgO which is a typical material constituting the magnetic element 28 is $9.7 \times 10^{-6}$/K as mentioned above. In terms of the reduction in thermal stress, the linear CTE of the metallic oxide is preferably greater than approximately a half of the linear CTE of MgO. Therefore, the linear CTE of the metallic oxide is preferably greater than $5 \times 10^{-6}$/K.

All of the linear coefficients of thermal expansion of the above-described metallic oxides are greater than $7 \times 10^{-6}$/K. Therefore, the linear CTE of the metallic oxide is more preferably greater than $7 \times 10^{-6}$/K.

Figure 4:
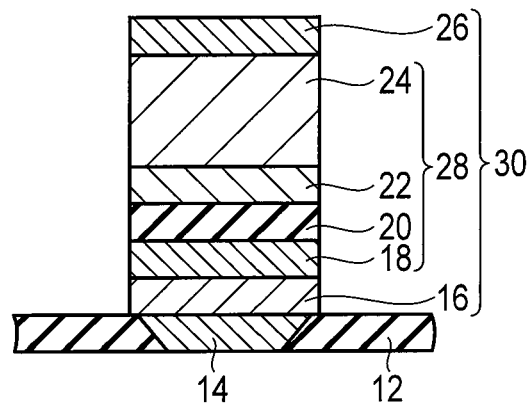
FIG. 4 is a cross-sectional view schematically showing a part of a method for manufacturing a magnetic memory device according to a second embodiment.

FIG. 4 and FIG. 5 are cross-sectional views schematically showing a method for manufacturing the magnetic memory device according to the second embodiment. The basic method for manufacturing the magnetic memory device of the second embodiment is the same as the first embodiment. Therefore, the explanations of the matters written in the first embodiment are omitted.

First, the step of FIG. 4 is conducted. The step of FIG. 4 is the same as the step of FIG. 1 of the first embodiment. By the step of FIG. 4, the stacked structure 30 including the magnetic element 28 is formed.

Next, the step of FIG. 5 is conducted. In the step of FIG. 5, the protective insulating film 42 covering the stacked structure 30 is formed. Specifically, the above metallic oxides are deposited at the temperature of approximately 300° C. by means of, for example, the MOCVD method.

Outside the protective insulating film 42, an SiN layer is formed as an oxygen blocking layer 52. Outside the oxygen blocking layer 52, an interlayer insulating film 54 is formed. An $SiO_2$ film is used for the interlayer insulating film 54.

Afterward, the magnetic memory device is completed through an interconnection step, etc.

By depositing the above-described metallic oxides, it is possible to easily form the protective insulating film 42 covering the stacked structure 30. Thus, the thermal stress between the magnetic element 28 and a protective insulating film 32 can be reduced by means of the easy method.

Embodiment 3

Figure 8:
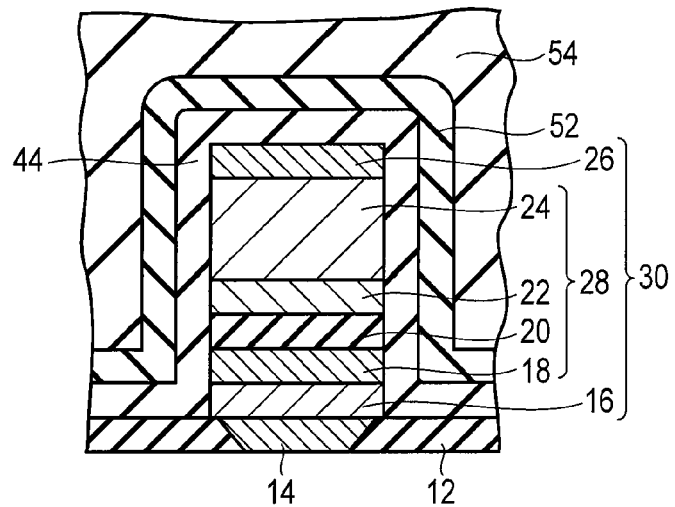
FIG. 8 is a cross-sectional view schematically showing a part of the method for manufacturing the magnetic memory device according to the third embodiment.

FIG. 8 is a cross-sectional view schematically showing a structure of a magnetic memory device according to a third embodiment. The basic structure of the third embodiment is the same as the first and second embodiments. Therefore, the structural components corresponding to the first and second embodiments are designated by the same reference numbers and symbols. Thus, the explanations of the matters written in the first and second embodiments are omitted.

In the magnetic memory device of this embodiment, a protective insulating film 44 covering a stacked structure 30 is formed by a metallic oxide. The metal element contained in the metallic oxide is selected from yttrium (Y), aluminum (Al), magnesium (Mg), calcium (Ca), zirconium (Zr) and hafnium (Hf). Specifically, as the metallic oxide, $Y_2O_3$, $Al_2O_3$, MgO, CaO, $ZrO_X$ and $HfO_X$ can be considered.

Figure 6:
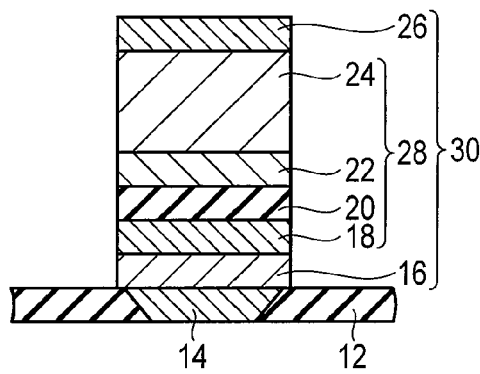
FIG. 6 is a cross-sectional view schematically showing a part of a method for manufacturing a magnetic memory device according to a third embodiment.
Figure 7:
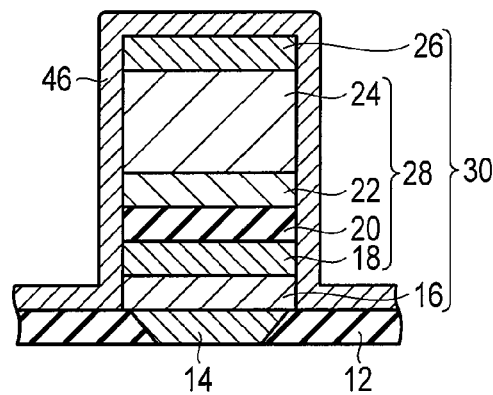
FIG. 7 is a cross-sectional view schematically showing a part of the method for manufacturing the magnetic memory device according to the third embodiment.

FIG. 6 to FIG. 8 are cross-sectional views schematically showing a method for manufacturing the magnetic memory device according to the third embodiment. The basic method for manufacturing the magnetic memory device of the third embodiment is the same as the first and second embodiments. Thus, the explanations of the matters written in the first and second embodiments are omitted.

First, the step of FIG. 6 is conducted. The step of FIG. 6 is the same as the step of FIG. 1 of the first embodiment. By the step of FIG. 6, the stacked structure 30 including a magnetic element 28 is formed.

Next, as shown in FIG. 7, a metal film 46 covering the stacked structure 30 is formed. The metal element contained in the metal film 46 is selected from yttrium (Y), aluminum (Al), magnesium (Mg), calcium (Ca), zirconium (Zr) and hafnium (Hf). The thickness of the metal film 46 is preferably greater than or equal to 1 nm because the metal film needs to be a continuous film to completely cover the magnetic element. After the stacked structure 30 is formed, the metal film 46 is preferably formed by the in-situ process. In this manner, it is possible to inhibit the oxidation of the magnetic element due to the exposure to the air. The oxidation due to the air exposure is unstable oxidation which cannot be controlled.

Next, as shown in FIG. 8, a metallic oxide film is formed by oxidizing the metal film 46. By this metallic oxide film, the protective insulating film 44 is formed. Specifically, by using plasma oxidation including radical oxidation and ion oxidation, etc., the metallic oxide film 44 is formed. The radical and ion oxidations have excellent controllability by controlling plasma. Further, the metallic oxide film 44 can be also formed by natural oxidation.

Outside a protective insulating film 44, an SiN layer is formed as an oxygen blocking layer 52. Outside the oxygen blocking layer 52, an interlayer insulating film 54 is formed. An $SiO_2$ film is used for the interlayer insulating film 54.

Afterward, the magnetic memory device is completed through an interconnection step, etc.

Thus, by oxidizing the metal film 46 to form the metallic oxide film (the protective insulating film 44), the thermal stress can be inhibited. The linear CTE of the metal film 46 is close to the linear CTE of the material contained in the magnetic element 28. Since this metal film 46 is gradually oxidized to form the metallic oxide film 44 by obtaining atom migration (mobility), it is possible to form the metallic oxide film (the protective insulating film 44) without adding a large interface stress or thermal stress between the magnetic element and the protective film. Therefore, even if a metallic oxide film whose linear CTE is comparatively small such as $HfO_X$ is used (the linear CTE of $HfO_X$ is $3.8 \times 10^{-6}$/K), the thermal stress can be reduced.

The above-described metal elements contained in the metal film 46 can more easily perform oxidation than the material contained in the magnetic element 28. Therefore, it is possible to easily form the metallic oxide film (the protective insulating film 44) without applying a large thermal stress.

In the first to third embodiments, the underlayer 16, the storage layer 18, the tunnel barrier layer 20, the reference layer 22, the shift cancelling layer 24 and the cap layer 26 are included in the stacked structure 30. However, at least only a layer constituting the magnetic element 28 may be included in the stacked structure 30.

Further, in the first to third embodiments, the magnetic element 28 includes the storage layer 18, the tunnel barrier layer 20, the reference layer 22 and the shift cancelling layer 24. However, the shift cancelling layer 24 may not be included in the magnetic element 28. More generally, the magnetic element 28 may only include a magnetic layer and have a storage effect.

Each of above described MTJ structures can be introduced as MTJ elements of memory cells. Memory cells, memory cell arrays and memory devices are disclosed in U.S. patent application Ser. No. 13/420,106. Also, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a stacked structure including a magnetic element;
a protective insulating film covering the stacked structure; and
an interface layer provided at an interface between the stacked structure and the protective insulating film,
wherein the interface layer contains a first predetermined element selected from argon (Ar), xenon (Xe), krypton (Kr), neon (Ne), phosphorus (P), and carbon (C), and a concentration of the first predetermined element contained in the interface layer is higher than both of (i) a concentration of the first predetermined element contained in the magnetic element and (ii) a concentration of the first predetermined element contained in the protective insulating film.

2. The device of claim 1, wherein the magnetic element contains at least one of cobalt (Co), iron (Fe), boron (B) and magnesium (Mg).

3. The device of claim 1, wherein the protective insulating film contains silicon (Si) and nitrogen (N).

4. The device of claim 1, wherein a linear coefficient of thermal expansion of at least one material contained in the magnetic element is greater than a linear coefficient of thermal expansion of a material contained in the protective insulating film.

5. The device of claim 1, wherein the magnetic element includes a first magnetic layer, a second magnetic layer, and a nonmagnetic layer provided between the first magnetic layer and the second magnetic layer.

6. A magnetic memory device comprising:
a stacked structure including a magnetic element;
a protective insulating film covering the stacked structure; and an interface layer provided at an interface between the stacked structure and the protective insulating film, wherein the interface layer contains a second predetermined element selected from nitrogen (N) and boron (B), and a concentration of the second predetermined element contained in the interface layer is higher than both of (i) a concentration of the second predetermined element contained in the magnetic element and (ii) a concentration of the second predetermined element contained in the protective insulating film.

7. The device of claim 6, wherein the magnetic element contains at least one of cobalt (Co), iron (Fe), boron (B) and magnesium (Mg).

8. The device of claim 6, wherein the protective insulating film contains silicon (Si) and nitrogen (N).

9. The device of claim 6, wherein a linear coefficient of thermal expansion of at least one material contained in the magnetic element is greater than a linear coefficient of thermal expansion of a material contained in the protective insulating film.

10. The device of claim 6, wherein the magnetic element includes a first magnetic layer, a second magnetic layer, and a nonmagnetic layer provided between the first magnetic layer and the second magnetic layer.

* * * * *